United States Patent [19]

Skorup

[11] 3,943,551
[45] Mar. 9, 1976

[54] LSI ARRAY USING FIELD EFFECT TRANSISTORS OF DIFFERENT CONDUCTIVITY TYPE

[75] Inventor: Gordon Edward Skorup, Marlton, N.J.

[73] Assignee: RCA Corporation, New York, N.Y.

[22] Filed: Apr. 10, 1974

[21] Appl. No.: 459,599

[30] Foreign Application Priority Data
Apr. 30, 1973 United Kingdom............... 20550/73

[52] U.S. Cl. .................... 357/42; 357/46; 357/51; 357/54; 357/23; 357/44
[51] Int. Cl.² H01L 27/02; H01L 29/78; H01L 29/34
[58] Field of Search ............. 357/42, 44, 46, 54, 51, 357/23

[56] References Cited
UNITED STATES PATENTS
3,771,217  11/1973  Hartman............................. 357/54

Primary Examiner—Stanley D. Miller, Jr.
Assistant Examiner—E. Wojciechowicz
Attorney, Agent, or Firm—H. Christoffersen; Henry I. Schanzer

[57] ABSTRACT

A large scale integrated (LSI) array of standard cells arranged in rows and columns adapted to receive different metallization patterns for producing custom circuits. Disposed in one half of each cell is a first power contact and contacts for the sources, drains and gates of field effect transistors of one conductivity type. Disposed in the other half of each cell is a second power contact and contacts for the sources, drains and gates of field effect transistors of complementary conductivity type. The pattern formed by the contacts in one half of a cell is the mirror image of the pattern formed by the contacts in the other half of the cell. The symmetry of the components of each cell is such that the metal interconnection pattern of a cell or a combination of cells for producing a given logic function may be inverted about the horizontal or the vertical plane of symmetry of the cell for producing a logic function relates to said given logic function.

13 Claims, 15 Drawing Figures

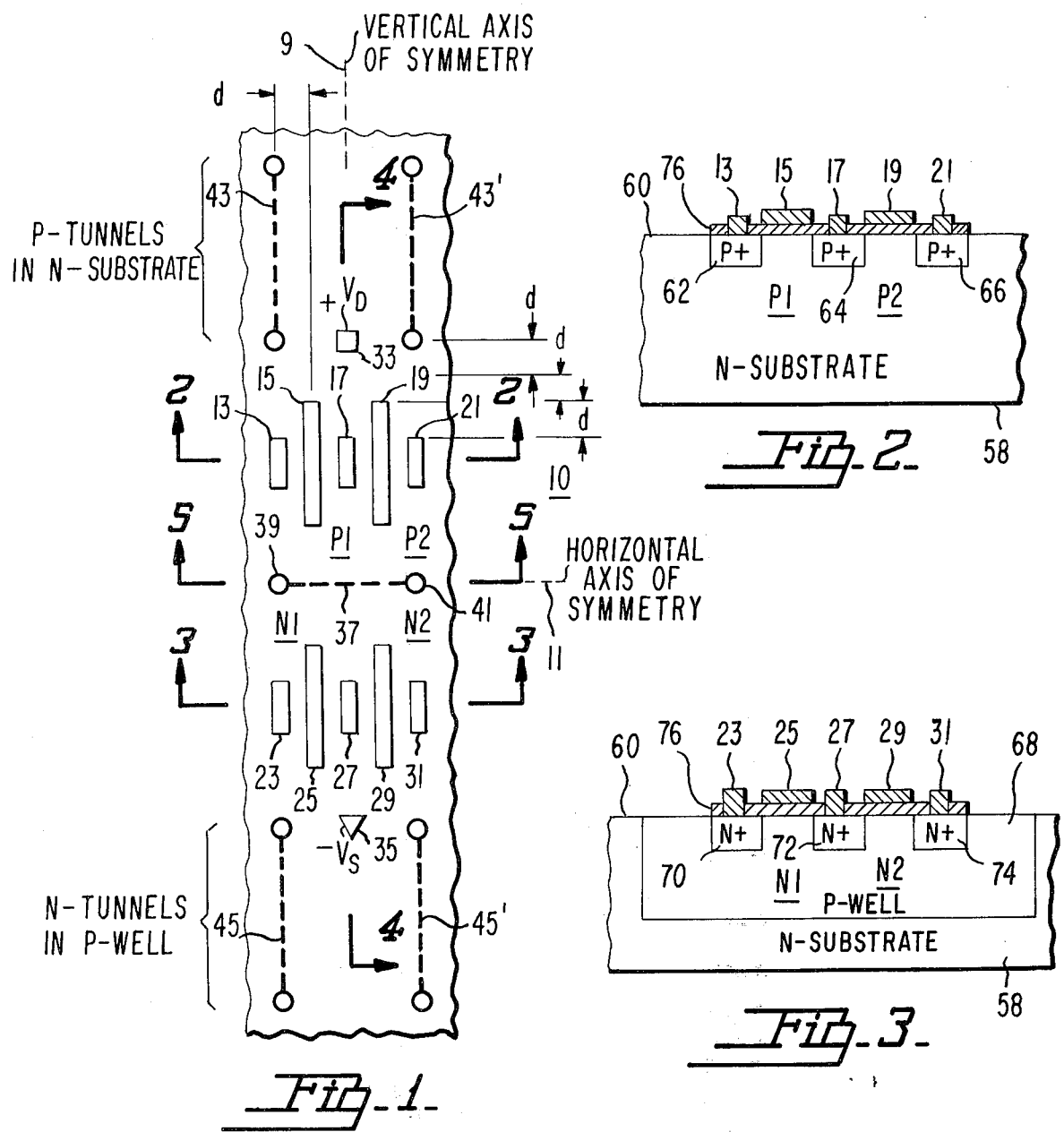
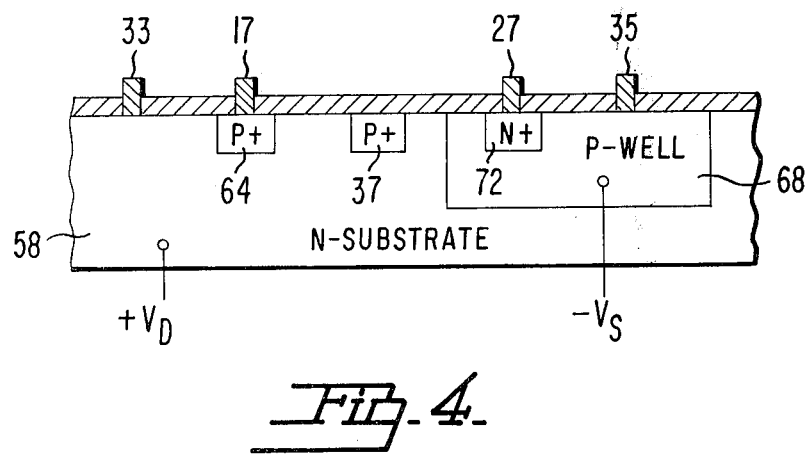

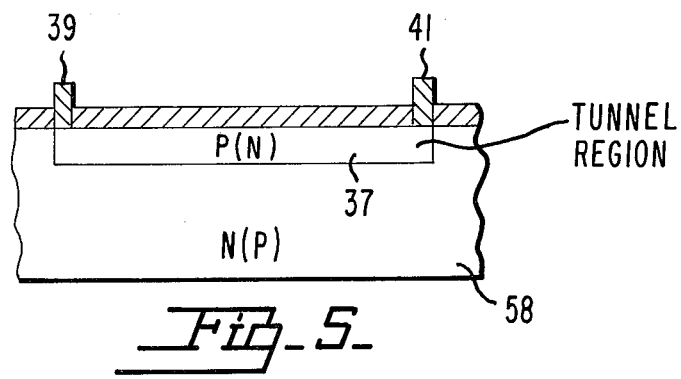
Fig. 5
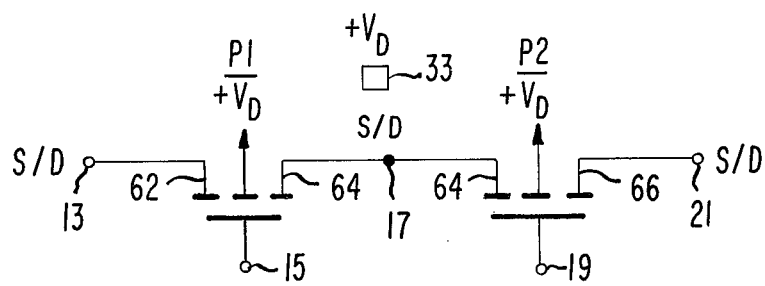
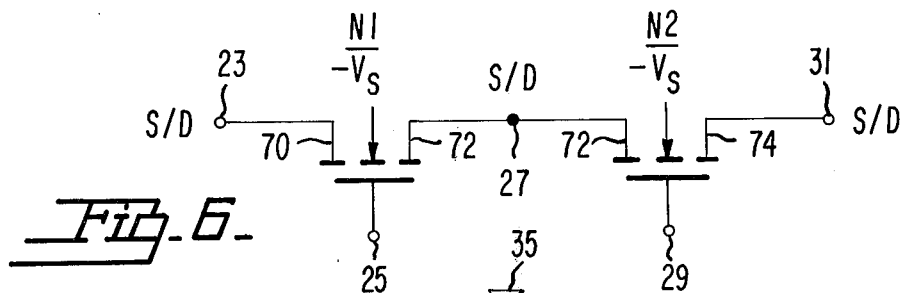
Fig. 6
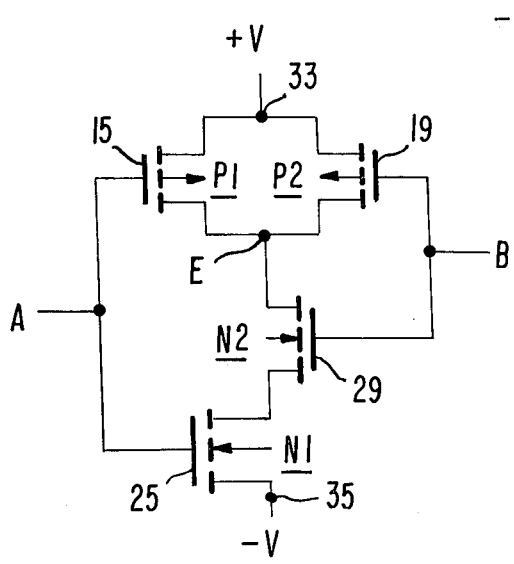
Fig. 7B
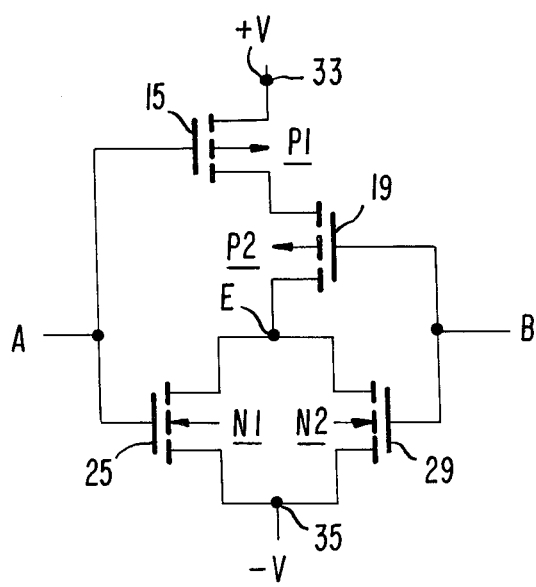
Fig. 8B

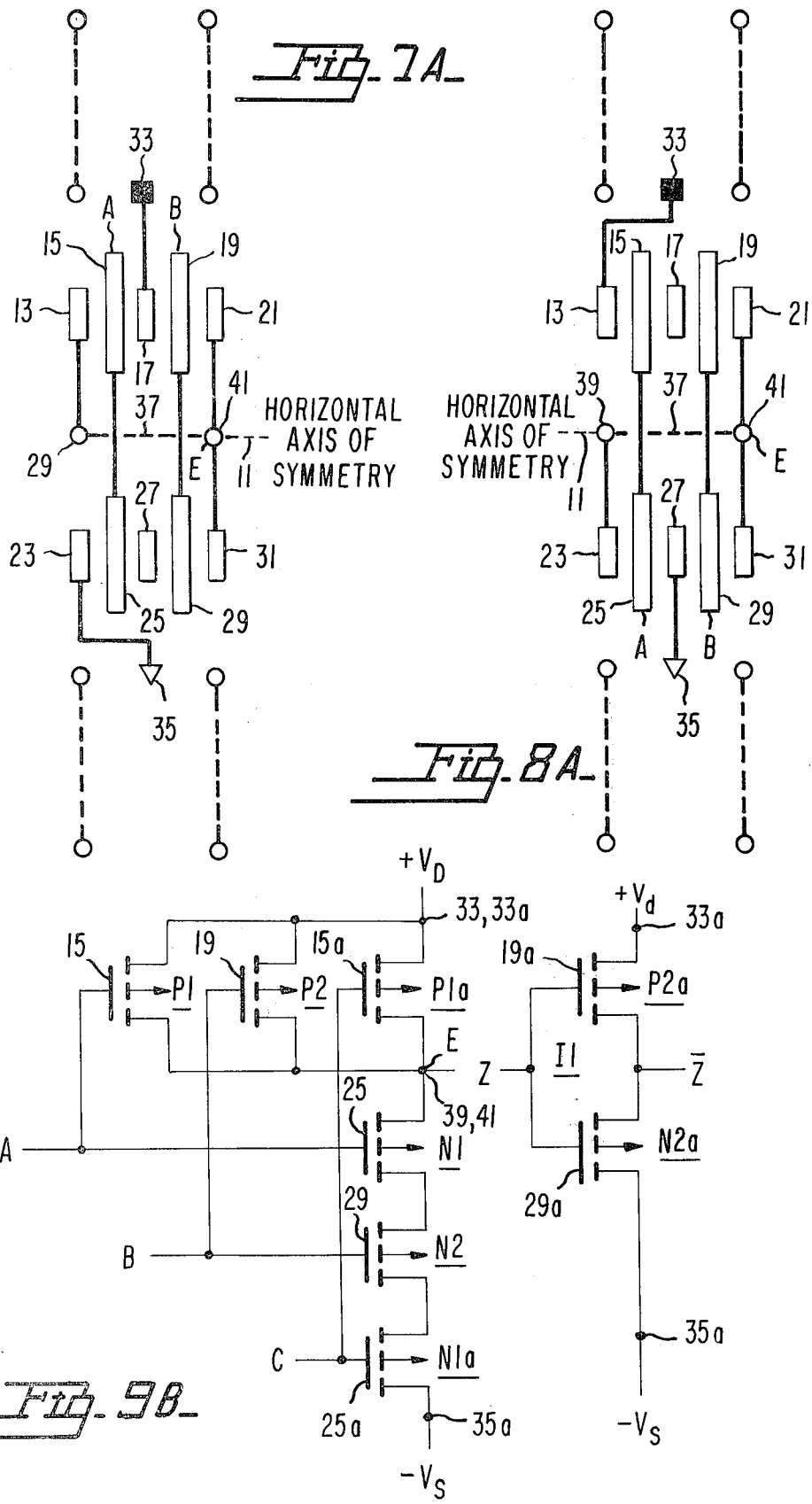

LSI ARRAY USING FIELD EFFECT TRANSISTORS OF DIFFERENT CONDUCTIVITY TYPE

This invention relates to variable identity cells (i.e., cells whose components may be interconnected to produce many different functions) and to large scale integrated (LSI) circuits employing these cells.

The manufacture of an LSI circuit requires many fabrication steps and the preparation of different fabrication masks for each of the fabrication steps. The cost of a new set of fabricating masks for each new design is prohibitive for low volume orders. One way (known as the Master Slice approach) of minimizing the cost of low volume LSI circuits is to distribute the cost of all the fabricating masks except for the metallization mask, which marks the final fabricating step, among different functional or system designs. In LSI circuits manufactured according to this approach, the same fabricating masks, such as diffusion and insulation masks, are used for every functional design, but different metallization masks are required for each new or different design. The component layout is standardized and fixed, and only the final metallization pattern is customized for each new application. The success of this approach depends upon whether an adequate number of different applications of sufficient functional complexity can be designed with a fixed component layout in order to satisfy the economics of distributed fabricating costs. Accordingly, it is important to provide a component layout which affords not only an efficient use of chip or substrate area but also a sufficient degree of design flexibility in order to assure an adequate number of different applications of sufficient functional complexity.

This approach generally involves the organization of the circuit components into an array of substantially identical component cells or building blocks which may have a fixed or variable functional identity. The variable identity cell affords the system or application designer the flexibility of specifying the functional identity of a cell, a group of cells, parts of a cell and various combinations thereof such that the functional complexity of the chip is greatly enhanced. It is extremely important to provide a cell which is not only efficient in terms of substrate area usage but is suitable for implementing enough different applications of sufficient functional complexity in order to justify the costs.

According to one aspect of the invention, a variable identity cell includes a first plurality of transistors of first conductivity type, and a second plurality of transistors of second conductivity type. Each of the transistors has a conduction path and a control electrode for controlling the conductivity of the conduction path. The conduction paths of the transistors of first conductivity type are connected end-to-end, and the conduction paths of the transistors of second conductivity type are connected end-to-end. The ends of each transistor conduction path are connected to two different uncommitted contacts, with the adjacent ends of adjacent conduction paths being connected to the same contact. These contacts are uncommitted since their function is not defined until the final metallization step. The cell also includes a first power contact associated with said first plurality of transistors and a second power contact associated with said second plurality of transistors. The first power contact and the contacts for said first plurality of transistors form a pattern which is the mirror image of the pattern formed by said second power contact and the contacts for said second plurality of transistors with respect to a plane of symmetry lying between the first and second plurality of transistors.

In a preferred embodiment, the transistors of first and second conductivity type are disposed along a body of material having a surface. The transistors include spaced-apart, doped regions which are common to adjacent transistors of the same conductivity type. Two spaced-apart regions define the ends of the conduction path of a transistor. Contacts formed on said surface are connected to each of said doped regions, and additional contacts formed on said surface between said doped regions are the control electrodes of the transistors.

Also included in the preferred embodiment is a tunnel or doped region disposed along the plane of symmetry of the cell. The tunnel has access points to enable the interconnection of the components of a cell or cells with minimal metal runs.

In the accompanying drawings, like characters denote like components; and

FIG. 1 is a top view of a variable identity cell embodying the invention;

FIGS. 2, 3, 4 and 5 are cross-sectional diagrams of portions of the cell of FIG. 1;

FIG. 6 is a schematic diagram of the active components of the cell of FIG. 1;

FIG. 7A is a top view of a cell embodying the invention metallized to form a two-input NAND gate;

FIG. 7B is a schematic diagram corresponding to the gate of FIG. 7A;

FIG. 8A is a top view of a cell embodying the invention metallized to form a two-input NOR gate;

FIG. 8B is a schematic diagram corresponding to the gate of FIG. 8A;

FIG. 9B is a schematic diagram corresponding to the gate of FIG. 9A;

Figure 9A:
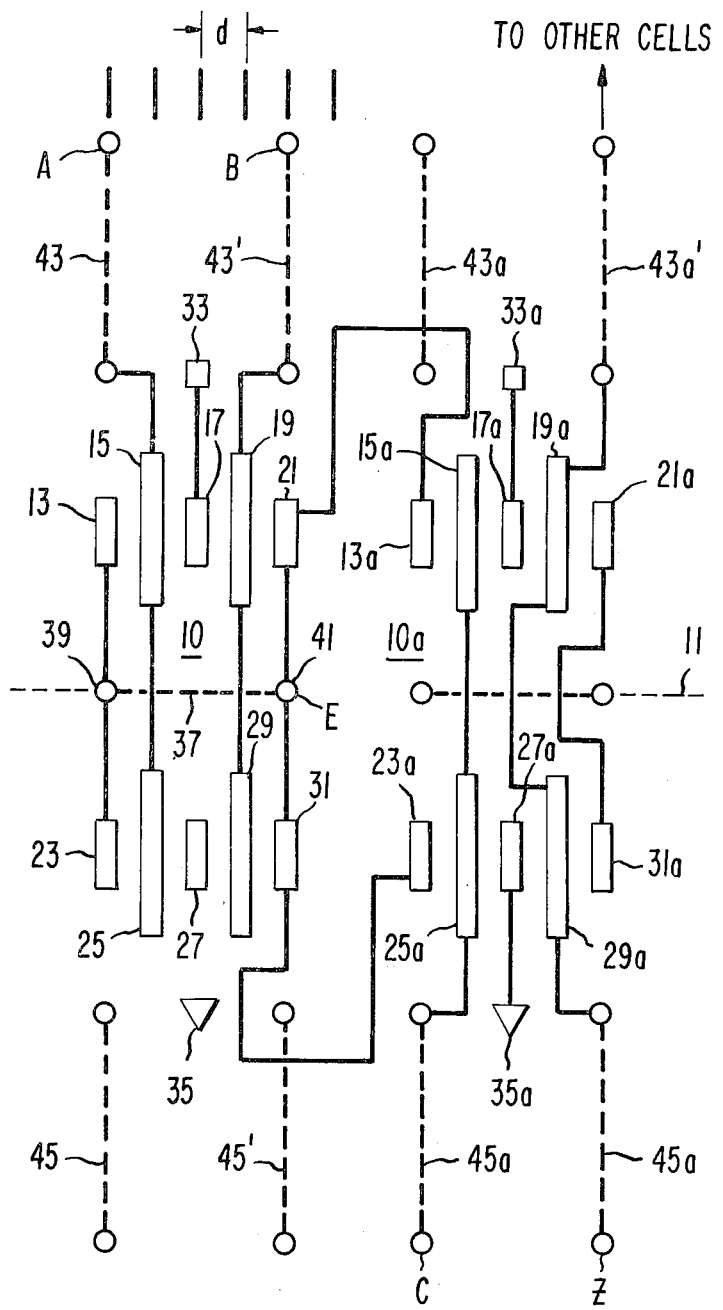
FIG. 9A is a top view of a cell embodying the invention metallized to form a three-input NAND gate.

The invention is illustrated using insulated-gate field-effect transistors (IGFETs) of the enhancement type formed in bulk silicon. The IGFETs illustrated in the figures each have a metal gate overlying the oxide insulator and are knoown as metal-oxide-semiconductor (MOS) transistors. However, it is to be understood that instead of metal, polysilicon could be used, and the transistors could be formed on an insulator substate such as sapphire. It should also be understood that the invention may be practiced using any other suitable type of transistor—e.g., depletion type IGFETs, bipolar transistors, or junction field-effect devices.

To better understand the detailed discussion to follow, two points pertinent to IGFETs are listed below:

1. The IGFETs have a first region and a second region, referred to as the source and drain, defining the ends of a conduction path, and a control electrode (gate) whose applied potential determines the conductivity of the conduction path. For the P-type IGFET, the source region is defined as that one of the regions having the most positive potential applied thereto. For an N-type IGFET, the source region is defined as that region having the least positive potential applied thereto.

2. The IGFETs are bidirectional in the sense that current can flow in either direction in the conduction path and either region may be operated as a source or as a drain.

The illustrated invention makes use of these features to generate variable identity cells.

The layout of a cell 10 embodying the invention is illustrated in FIG. 1. Each cell includes a horizontal axis of symmetry (axis 11) on one side of which are formed the metal contacts and gates for two transistors (P1, P2) of P-conductivity type and on the other side of which are formed the metal contacts and gates for two transistors (N1, N2) of N-conductivity type. In addition, there are contacts (33 and 35) for supplying power to the cell and tunnel regions 37, 43, 43', 45 and 45' for interconnecting the components of the cell. Axis 11 defines the horizontal plane of symmetry of the cell. The contacts and tunnels on one side of the cell are mirror imaged on the other side of the cell when the cell is folded about axis 11. Axis 9 defines the vertical axis of symmetry of the cell. The contacts on one side of axis 9 are mirror imaged on the other side when the cell is folded about axis 9.

Before examining FIG. 1 in detail, reference should be made to FIGS. 2 and 3 which are cross-sections of parts of cell 10 of FIG. 1 and which illustrate the typical manufacture of transistors P1 and P2 and transistors N1 and N2, respectively.

FIG. 2 shows that the cell 10 includes a body of semiconductor material 58 of first (N) conductivity type having a surface 60. Transistors P1 and P2 of second (P) conductivity type are formed by diffusing spaced-apart, doped regions (62, 64, 66) of second conductivity type in the body 58 at the surface thereof. Regions 62 and 64 define the ends of the conduction path of transistor P1 and regions 64 and 66 define the ends of the conduction path of transistor P2. The spaced apart regions form the source and drain regions of the transistors.

In FIG. 3, transistors N1 and N2 are formed by diffusing a well region 68 of P-conductivity type in the semiconductor body 58. Spaced apart regions 70, 72 and 74 of N+ conductivity type are diffused within the well region at the surface thereof. Regions 70 and 72 define the ends of the conduction path of transistor N1 and regions 72 and 74 define the ends of the conduction path of transistor N2.

In FIGS 2 and 3, an insulator (oxide) layer 76 is formed on the surface 60 of the semiconductor body 58. Electrodes 15, 19, 25 and 29, which may be of metal or other conductive material, are positioned over the space between two doped regions and function as gates or control electrodes. In this application, for ease of description, the gate electrode is also referred to as a contact. Source and drain electrodes (13, 17, 21, 23, 27 and 31) are formed by means of conductive material which contact the source and drain regions through holes, in the oxide, located over the doped regions. These electrodes are referred to, herein, as contacts.

In FIGS. 2 and 3, each pair of transistors is shown having a common region (64, 72). But, it should be evident that each transistor of a pair could have two separate regions defining its source and drain, and one of the two regions of each transistor could then be connected in common to a single contact (e.g., 17).

Returning to FIG. 1, the center-to-center distance between contacts for the drains, sources and gates of the transistors is fixed, being equal to a distance, d, or an integral multiple thereof. The row of contacts for the P-type transistors includes contacts 13, 15, 17, 19 and 21. The row of contacts for the N-type transistors includes contacts 23, 25, 27, 29 and 31. Contacts 13, 17 and 21 and contacts 23, 27 and 31 may function either as source or as drain electrodes depending on the polarity of the potential applied to the contacts and/or the final metallization of the cell. Contacts 13 and 23 are formed on the same vertical line; gate contacts 15 and 25 are formed on the same vertical line; contacts 17 and 27 are formed on the same vertical line; contacts 19 and 29 are formed on the same vertical line; and contacts 21 and 31 are formeed on the same vertical line.

Contacts 33 and 35 are provided for the application thereto of operating potentials of $+V_d$ volts and $-V_s$ volts, respectively. As shown in FIG. 4, the operating potentials ($+V_d$ and $-V_s$) are applied to the substrates in which the transistors are formed. Contacts 33 and 35 make contact to the substrate regions over which they are formed by means of holes in the oxide layer overlying the substrate. Contacts 33 and 35 as well as the other contacts are of relatively high conductivity material and may be metal or polysilicon. The use of power contacts having limited surface area, as compared to power conductors running the length of the cell, enables the routing of metal for interconnecting the cell or parts of cells or one cell with other cells with little interference with the power conductors. As shown in FIG. 1, contact 33 is located above contact 17, and contact 35 is located below contact 27. Contacts 33, 35, 17 and 27 are on the same vertical line which marks the vertical center line of axis of symmetry of the cell.

Each cell includes five tunnels. The tunnels, one of which is shown in FIG. 5, are diffused regions of N or P conductivity type extending below the surface of the array. The access holes for the tunnel regions are covered by metal to make contact to the diffused regions.

In FIG. 1 the access contacts to the tunnel regions are indicated by circles and the tunnels are shown by dashed lines. Tunnel region 37, of P-conductivity type, is located along axis 11 and has an access point or contact 39 on the same vertical line as contacts 13 and 23 and another access point or contact 41 on the same vertical line as contacts 21 and 31. Tunnel region 37 is extremely important in enabling the end contacts (13 and 21, or 23 and 31) of one pair of transistors of a cell to be connected in common and/or to contacts of the other pair of transistors of a cell without extensive metal runs. Two additional tunnel regions 43 and 43' of P-conductivity material ae formed above and on the same vertical line as contacts 13 and 21, respectively. Two tunnel regions 45 and 45' are formed below and on the same vertical line as contacts 23 and 31, respectively. The tunnels provide means for interconnecting elements of the cell or cells without the necessity of long metal runs over the surface of the array or cell. That is, the tunnels are cross-overs or cross-unders which enable the equivalent of two levels of interconnections. It should be understood that the tunnel regions could be of any conductivity type and may be polysilicon or metal.

The standard cell 10 thus includes a fixed metal pattern forming the gate, source and drain contacts as well as the power contacts and the contacts for accessing the tunnel regions.

FIG. 6 illustrates, schematically, the active elements comprising each cell. Each cell includes two insulated-gate field-effect transistors (IGFETs) of P-type conductivity (P1, P2) and two IGFETs of N-type conductivity (N1, N2). Each IGFET has a conduction path whose two ends are defined by source and drain regions (S/D) and a control electrode. Transistor P1 is connected at one end of its conduction path to contact 13 and at the other end of its conduction path to contact 17, and at its gate to contact 15. Transistor P2 is connected at one end of its conduction path to contact 17, at the other end of its conduction path to contact 21, and at its gate to contact 19. Transistor N1 is connected at one end of its conduction path to contact 23, at the other end of its conduction path to contact 27, and at its gate to contact 25. Transistor N2 is connected at one end of its conduction path to contact 27, at the other end of its conduction path to contact 31 and at its gate to contact 29. In addition, as shown, each cell includes contacts 33 and 35 for the application thereof of $+V_d$ volts and $-V_s$ volts, respectively.

Contacts 33 and 35 are committed, i.e., their functions as power terminals are defined. The gate contacts are also committed in the respect that they always function as control electrodes.

The source/drain contacts are uncommitted in that the functions of these regions is not defined until an interconnection pattern is imposed on the cell. That is, these contacts may function either as source or as drain regions depending on how or where they are connected, as detailed below.

For example, as shown in FIGS. 2, 3 and 6, contact 17 may be connected to contact 33, in which event contact 17 functions as the source electrode and region 64 functions as the source regions of transistors P1 and P2. Regions 62 and 66 and contacts 13 and 21 then function as the drain regions and drain contacts, respectively, of transistors P1 and P2. Alternatively, contact 13 may be connected to contact 33, in which event region 62 and contact 13 function as the source and source contact, respectively, of transistor P1. Region 64 then functions as the drain of transistor P1 and as the source of transistor P2, and region 66 functions as the drain of transistor P2. Alternatively, contact 21 may be connected to contact 33 in which event region 66 functions as the source of transistor P2, region 64 functions as the drain of transistor P2 and the source of P1, and region 62 functions as the drain of transistor P1. Further still, contacts 13 and 21 may be connected in common, with contact 17 connected to or disconnected from contact 33 whereby the conduction paths of transistors P1 and P2 are connected in parallel.

Similarly, contact 27 may be connected to contact 35, in which event region 72 and contact 27 function as the sosurce regions and the source electrode, respectively, of transistors N1 and N2, and regions 70 and 74 function as the drain regions of transistors N1 and N2, respectively. Contacts 23 and 31 are then the drain electrodes of transistors N1 and N2, respectively. Alternatively, contact 23 may be connected to contact 35, in which event region 70 functions as a source of transistor N1, region 72 functions as the drain of transistor N1 and as the source of transistor N2, and region 74 functions as the drain of transistor N2. Alternatively, contact 31 may be connected to contact 35, in which event region 74 becomes the source electrode of transistor N2, region 72 becomes the drain of transistor N2 and source of transistor N1, and region 70 becomes the drain of transistor N1. Also, as for the P-type devices, the transistors may be interconnected without connection to a power contact. The conduction paths of transistors N1 and N2 may be connected in parallel by connecting contact 23 to contact 31. A signal may then be applied to terminal 27 and an output derived from contact 23 and 31.

It will now be shown that the transistors of one cell may be interconnected with each other or with transistors of other cells to perform a multiplicity of logic functions.

FIG. 7A shows a cell interconnected to form a two-input NAND gate. The custom metallization pattern is indicated by solid black lines. In FIG. 7A, contact 17 is connected to contact 33 and functions as the source electrode of transistors P1 and P2. Contacts 13 and 21 which function as the drain electrodes of transistors P1 and P2 are connected to opposite ends of tunnel region 37. Transistors P1 and P2 are thus connected in parallel. End 41 of tunnel 37, labelled E, is connected to contact 31 which functions as the drain electrode of transistor N2. The gate contacts 15 and 25 are connected in common, and a signal labelled A is applied thereto. Gate contacts 19 and 29 are connected in common, and a signal labelled B is applied thereto. Contact 23 is connected to contact 35 and functions as the source electrode of transistor N1. Contact 27 functions as the drain electrode of transistor N1 and as the source electrode of transistor N2. It should be appreciated that tunnel 37 enables contacts 13, 21 and 31 to be interconnected with three short metal runs.

FIG. 7B is the schematic equivalent of the circuit shown in FIG. 7A. In FIG. 7B the conduction paths of transistors P1 and P2 are connected in parallel between contact 33 and output terminal E and the conduction paths of transistors N1 and N2 are connected in series between output terminal E and contact 35. The gates of transistors P1 and N1 are connected in common, and the gates of transistors P2 and N2 are connected in common.

In the discussion of the operation of this and the other circuits to follow, positive logic is used to define the logic functions. That is, the most positive signal level (+V) is defined as a logic "1" or high, and the most negative signal (−V) is defined as the logic "0" or low. For ease of description $+V_d$ is assumed equal to +V and $-V_s$ is assumed equal to −V.

In FIG. 7B a signal A is applied to the gates of transistors P1 and N1 and a signal B is applied to the gates of transistors P2 and N2. Assume also that +V volts is applied to contact 33 and −V volts is applied to contact 35. The signal at output terminal E will be "high" if either one or both of signals A and B are "low" and will be low, if, and only if, both A and B are high. The circuit of FIG. 7A and 7B is thus a two-input NAND gate.

Rotating or mirroring the custom metallization pattern of FIG. 7A about horizontal axis 11 produces the interconnections shown in FIG. 8A. In FIG. 8A the cell is interconnected to form a two-input NOR gate. Contact 13 connected to contact 33 functions as a source electrode. As in FIG. 7A gates 15 and 25 are connected in common, and gates 19 and 29 are connected in common. Contact 17 functions as the drain electrode of transistor P1 and the source electrode of transistor P2. Contact 21 functions as the drain electrode of transistor P2 and is connected by metal to contact 31 and by means of tunnel 37 to contact 23. Contact 37 is connected to contact 35. Thus, as illustrated in FIG. 8B which is the schematic equivalent of FIG. 8A, transistors P1 and P2 are now connected in series between terminals 33 and 41 (E) and transistors N1 and N2 are now connected in parallel between terminals 41 and 35.

Structurally, by rotating the metallization pattern, those components that were in parallel in FIGS. 7A and 7B are connected in series in FIGS. 8A and 8B and those components that were connected in series in FIGS. 7A and 7B are connected in parallel in FIGS. 8A and 8B. It is important to note, therefore, that due to the symmetry of the cell, a single metallization mask can be used to generate the two different interconnection patterns.

In the circuit of FIGS. 8A and 8B the output signal present at terminal E is high if, and only if, A and B are low. If either one or both of signals A and B are high, the output at E is low. Functionally, the circuit of FIGS. 8A and 8B is a two-input NOR gate. The NOR function is the functional dual of the NAND function. Thus, due to the symmetry of the cell, a metallization pattern of the cell producing a given function (NAND) may be rotated about the horizontal axis of symmetry of the cell to produce the dual (NOR) of the given function.

FIGS. 9 and 10 illustrate the more than one cell and/or that parts of a cell can be metallized to produce a logic gate and that the metallization pattern producing a given function can be rotated about the axis of symmetry of the cell or cells to produce a function related to the given function.

FIGS. 9A and 9B depict the layout and the equivalent schematic diagram, respectively, for producing a three-input NAND gate. Referring to FIG. 9A, it may be seen that a cell 10 and a portion of a second cell 10a are interconnected to form the three-input NAND gate. The elements of cell 10a corresponding to those of cell 10 are like numbered with the addition of the reference character a. In addition to providing parts for the three-input NAND gate, the remainder of cell 10a may be used to form a complementary inverter I1. Inverter I1 includes transistors P2a and N2a having their source drain paths connected in series between contacts 33a and 35a and having their gates 19a, 29a connected in common. Contacts 17 and 17a are connected to contacts 33 and 33a, respectively. Contacts 17 and 17a function as the source electrodes for transistors P1, P2 and P1a. Contacts 13 and 21 are connected in common and contact 13a, which functions as the drain electrode of transistor P1a, is connected by a metal run to contact 21. Transistors P1, P2 and P1a are, therefore, connected in parallel between contacts 33, 33a and output terminal 41 labelled E. Transistors N1, N2 and N1a have their conduction paths connected in series between tunnel terminal 39 and contact 35a. This is achieved by connecting contact 31 to contact 23a and connecting contact 27a to contact 35a. FIG. 9B is the schematic equivalent of the interconnections shown on FIG. 9A. Transistors P1, P2 and P1a have their conduction paths connected in parallel between the positive power terminal and the output terminal 39. For purpose of the schematic, terminals 39 and 41 are considered to be the same point, and contacts 35 and 35a or 33 and 33a may be considered the same points. Transistors N1, N2 and N1a have their conduction paths connected in series between the output terminal 39 and the negative power terminal 35a. In addition, FIG. 9B shows inverter I1 which is independent of the NAND gate. Assume signals A, B and C to be applied to gates 15 and 25, 19 and 29 and 15a and 25a, respectively. The output signal E may then be expressed as $E = \overline{ABC}$.

Figure 10A:
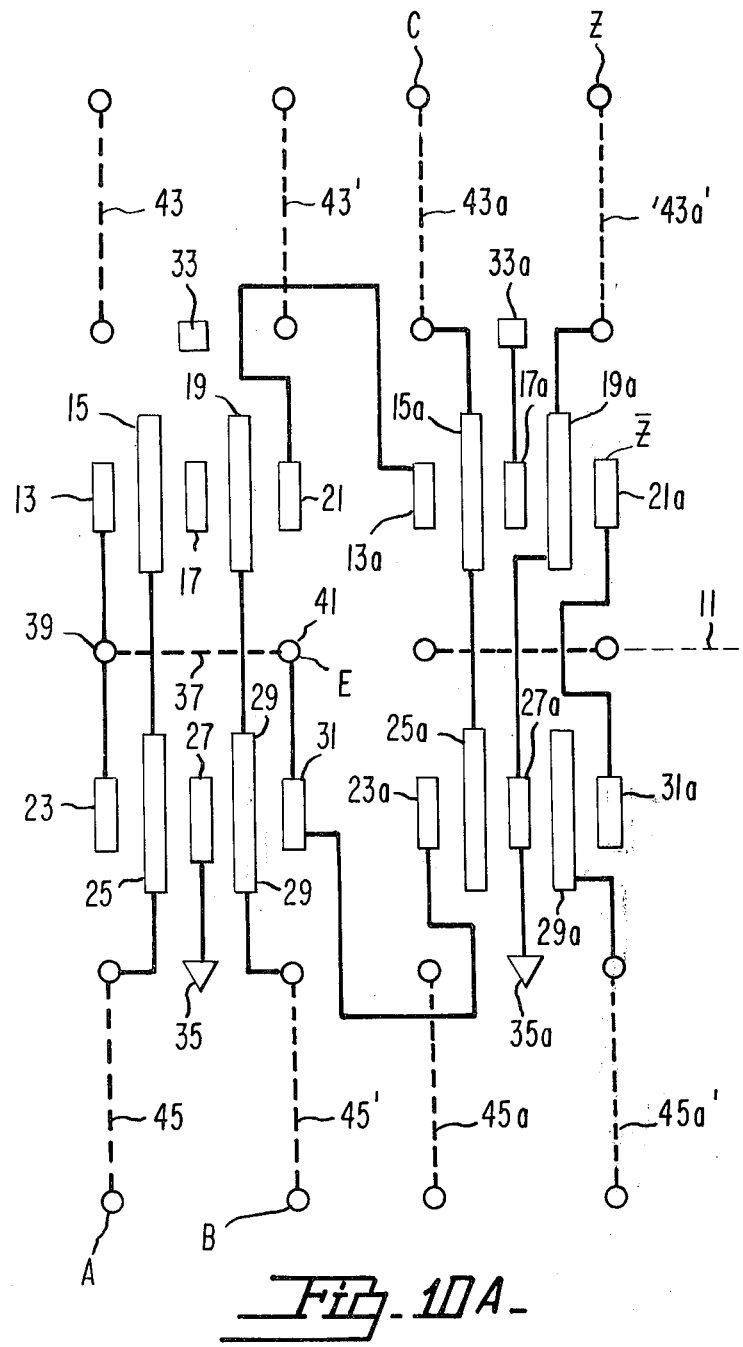
FIG. 10A is a top view of a cell embodying the invention metallized to form a three-input NOR gate.
Figure 10B:
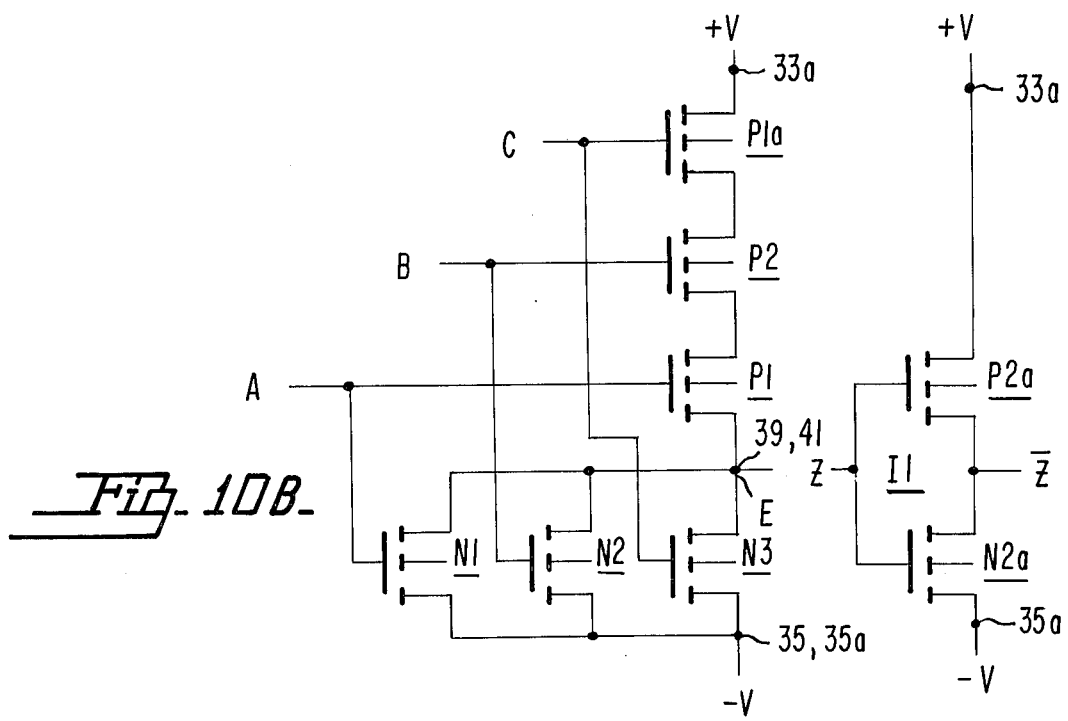
FIG. 10B is a schematic diagram corresponding to the gate of FIG. 10A.

Rotating the custom metal interconnections of FIG. 9A about the horizontal axis of symmetry 11 produces the metal interconnection shown in FIG. 10A. In the layout of FIG. 10A, contacts 27 and 27a are connected to contacts 35 and 35a, respectively. Contact 23a is connected to contact 31, and the latter is connected in common with contact 23 by means of tunnel 37. Thus, as shown in FIG. 10B, transistors N1, N2 and N1a are connected in parallel between power contact(s) 35, 35a and the output terminal(s) 39, 41. Contact 17a is connected to contact 33a and contact 13a is connected to contact 21 with contact 13 connected to contact 39. Transistors P1a, P2 and P1 are therefore connected in series as shown in FIG. 10B. In addition, in FIG. 10B, contacts 19a and 29a are connected in common and contacts 21a and 31a are connected in common as shown previously in FIG. 9A. Thus, the inverter I1 of FIGS. 10A and 10B is identical to the one shown in FIGS. 9A and 9B.

Assume as before that signals A, B and C are applied to the gates 15 and 25, 19 and 29 and 15a and 25a, respectively. The output signal at terminal 39, 41 may then be expressed as $E = \overline{A+B+C}$. As is well known, the circuit of FIG. 10B is that of a three-input NOR gate and the NOR function is the functional dual of the NAND function.

Rotating the custom metal pattern about the horizontal axis of symmetry causes those transistors that were connected in parallel in FIG. 9 to be connected in series in FIG. 10 and those transistors that were connected in series in FIG. 9 to be connected in parallel in FIG. 10. Furthermore, here again, a metallization pattern producing a given function produces the dual of the given function when rotated about the horizontal axis of symmetry of the cell.

It should also be noted that the custom metallization pattern of a cell may be rotated about the vertical axis of symmetry without causing any change in the function of the cell. This is evident from the examination of FIGS. 1, 7A and 8A. In FIGS. 9A and 10A rotating the metallization pattern about the vertical plane of symmetry lying between the two cells again causes no change in the functions performed by the cell but causes an inversion of the input and output points of the cells.

The role of the tunnel 37 is of great importance in enabling the interconnection of the components of the cell. That is, components on the same side of the horizontal axis of symmetry may be interconnected through the tunnel or, components on opposite sides of the horizontal axis of symmetry may be interconnected by means of very short metal runs. Also, as seen in FIGS. 7, 8, 9, 10, either end of the tunnel region may be used as an output terminal.

The simple and symmetrical layout of the components of the cell, including the contacts for the transistors, the operating potential and the tunnels enable a single custom metal mask to be used to produce a given function and functions related to the given function by the simple expedient of rotating the metal mask about the vertical or horizontal axes of symmetry.

It should be noted that the vertical tunnels 43, 43', 45 and 45' are useful in applying signals to cells and in coupling adjacent cells. Signals may be applied to elements of the cell by means of tunnels 43 and 43' or tunnels 45 and 45'. For example, in FIG. 9A, signals A and B are applied to one of the ends of tunnels 43 and 43', respectively, and the other ends of tunnels 43 and 43' are connected to contacts 17 and 19, respectively. Similarly, signal C is applied to one end of tunnel 45a and the other end of tunnel 45a is connected to contact 25a.

It should also be noted that the vertical tunnels (43, 43', 45, 45') enable the coupling of signals from one row to the other in a vertical direction. For example, in FIG. 9A, a signal Z may be applied to one end of tunnel 45a'. The other end of tunnel 45a' is connected to contact 29a which, in turn, is connected to contact 19a. Contact 19a is connected to one end of tunnel 43a'. The signal Z is thus available at the other end of tunnel 43a' and may be routed to any other circuit on the array.

Figure 11:
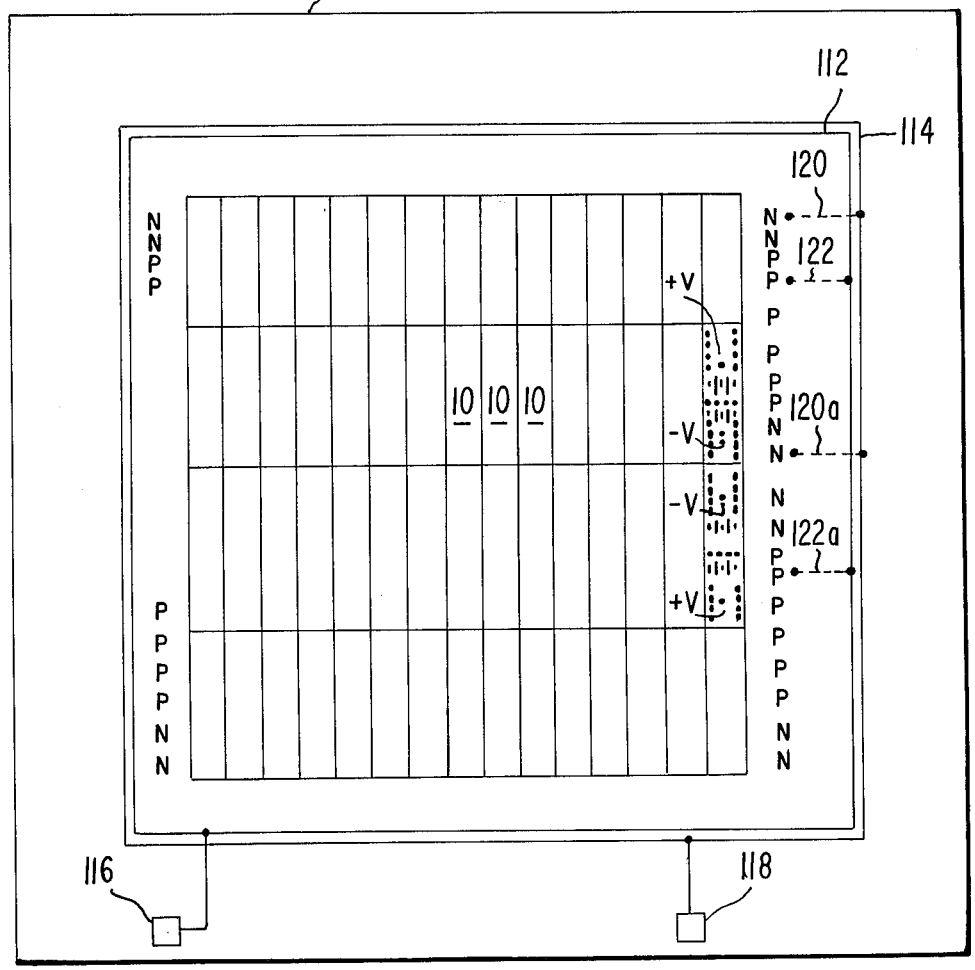
FIG. 11 is a top view of an LSI array of cells embodying the invention.

Considerable benefit is obtained in LSI arrays employing the standard cell of the invention. FIG. 11 shows an array of cells 10 arranged in rows and columns. Adjacent rows of cells are the mirror image of each other. Between the chip periphery 100 and the power bus lines 112, 114 is a space for forming bonding pads and various interface or load circuits. The operating potential (+V and −V) may be applied to pads 116 and 118 which are connected to the bus lines. In practice, there are many available pads around the chip and the most convenient selection is made for interconnecting the bus lines to pads. The operating potential is then distributed from the bus lines to the various cells by means of tunnels 120, 122, 120a, 122a (as shown by dashed lines in FIG. 11) connected between the bus lines and regions such as substrate regions 58 and P-well regions 68 shown in FIGS. 3 and 4. An examination of the layout of the array indicates that, due to the power distribution system, which uses the substrates 58, 68 and power contacts, virtually the whole surface area of the array is available for cell interconnection without interference with or from power lines.

Another feature of the invention is that a uniform grid structure is employed for routing the metal. That is, the masks on which are drawn the fixed and custom metal interconnections include imaginary grid lines of the type shown external to the cells in FIGS. 1, 7A, 8A, 9A and 10A. These "imaginary" grid lines which are spaced apart by a distance d determine the paths along which metal interconnections are routed and define the grid structure. The cell, as manufactured, does not have actual grid lines formed on the surface thereof. But, the metal interconnections follow lines corresponding to the imaginary grid lines. All the device access points have their centers positioned over a grid line. Thus, as mentioned above, the center line distance between contacts in the cells are spaced apart by a distance, d, or by an integral multiple thereof both vertically and horizontally. This rule is extended to include the metal runs. That is, the metallization pattern is such that the center distance between any two metal lines is made equal to d, or an integral multiple of d, where d is the minimum space between the center lines of two adjacent contacts. Applying this rule to the metallization pattern helps to achieve the high degree of symmetry and ensures that computer programming for routing the custom metal is made simple.

A uniform grid structure for metal routing eliminates the possibility of having two metal runs spaced too closely. It also allows each of layout and checking.

The grid structure used, allows a given metal interconnect pattern to be implemented more than one technology. Since the metal interconnect pattern uniquely identifies a given logic design, this allows the same design to be implemented, for example in SOS (silicon-on-sapphire) without any redesign.

The layout of the array alloows expansion and contraction of the chip size and logic cell count by the simple means of removing or adding rows or columns of devices. For example, a row may be removed from the array or a column of elements may be removed from the array.

Due to the uniform patterning of devices, standard logic functions can be defined as shown, for example, in FIGS. 7 through 10. These logic cells can be made into decals with adhesive backing which allow the designer to paste the decals on a layout form and draw metal lines with a pencil to implement an LSI design.

What is claimed is:

1. A cell having a surface on which are formed contacts adapted to receive different interconnection patterns for producing different functions, said cell comprising:

a first plurality of transistors of first conductivity type, and a second plurality of transistors of second conductivity type; each one of said transistors having first and second regions defining the ends of a conduction path and a control electrode for controlling the conductivity of the conduction path; the first and second regions of the transistors of said first conductivity type being physically located to have their conduction paths lying end-to-end, and the first and second regions of the transistors of said second conductivity type being physically located to have their conduction paths lying end-to-end;

a first set of said contacts, connected to the first and second regions of said first plurality of transistors;

a second set of said contacts connected to the first and second regions of said second plurality of transistors; the first and second regions of each transistor being connected to different contacts, with adjacent transistors of the same conductivity type having a common region connected to a contact;

two additional contacts, one being designated as a first power contact and the other being designated as a second power contact for the application therebetween of an operating potential for the cell, said first and second power contacts being associated with and disposed adjacent to and apart from said first and second sets of contacts, respectively; and said first power contact and the contacts for said first plurality of transistors forming a pattern which is the mirror image of the pattern formed by said second power contact and the contacts for said second plurality of transistors with respect to a plane of symmetry lying between said first and second plurality of transistors.

2. The cell as claimed in claim 1 wherein said transistors are insulated-gate field-effect transistors (IGFETs) and wherein said first conductivity type is one of N and P conductivity type and said second conductivity type is the other of said N and P conductivity type.

3. The cell as claimed in claim 2 wherein the center lines of the contacts in each set of contacts are spaced apart by a given distance or by a multiple of said given distance.

4. A cell having conductive contacts adapted to receive different interconnection patterns for producing different functions, comprising:
   a body of material having a surface;
   a first plurality of transistors of first conductivity type, each having two spaced apart doped regions of said first conductivity type, disposed along said surface, defining the ends of the conduction path of a transistor and a control electrode overlying the space between said two regions; a second plurality of transistors of second conductivity type, each including two spaced apart doped regions of second conductivity type, disposed along said surface, defining the ends of the conduction path of a transistor and a control electrode overlying the space between said two doped regions;
   a first set of said conductive contacts disposed along said surface for contacting said spaced apart regions of said first plurality of transistors, and a like set of said conductive contacts disposed along said surface for contacting said spaced apart regions of said second plurality of transistors;
   two additional ones of said conductive contacts designated as first and second power contacts; said first and second power contacts being spaced apart and disposed along said surface of said body for the application therebetween of an opeating potential for said cell, said first power contact being located adjacent to and apart from said first plurality of transistors, and said second power contact being located adjacent to and apart from said second plurality of transistors; and
   said first power contact and the contacts for said first plurality of transistors being arranged to form a pattern which is the mirror image of the pattern formed by said second power contact and the contacts for said second plurality of transistors with respect to a plane of symmetry lying between said first and second plurality of transistors.

5. The cell as claimed in claim 4 further including a tunnel comprising a doped region disposed along said surface and extending along said plane of symmetry, said tunnel region having two access points, one access point being adjacent to contacts near one end of the cell, and the other access point being adjacent to contacts near the other end of the cell.

6. The cell as claimed in claim 4 wherein said transistors are insulated-gate field-effect transistors and wherein each one of said transistors of first conductivity type is one of N and P conductivity type, and, wherein, each one of said transistors of second conductivity type is of the other one of said N and P conductivity type.

7. The cell as claimed in claim 4, wherein said body of material includes a semiconductor substrate of first conductivity type;
   wherein said spaced apart regions of said transistors of second conductivity type are regions of second conductivity type diffused in said substrate of first conductivity type;
   wherein there is formed at least one well region of second conductivity type within said substrate;
   wherein the spaced apart regions of any transistor of said first conductivity type are regions of first conductivity type diffused in said well region;
   wherein said first conductivity type is one of N and P conductivity type, and wherein said second conductivity type is the other one of said N and P conductivity type; and
   wherein each of said transistors has an insulator formed over the region between the source and drain regions thereof, and a gate electrode over the insulator.

8. The cell as claimed in claim 7, wherein each one of said first and second plurality of transistors is comprised of a pair of transistors, and wherein each pair of transistors includes first, second and third ones of said spaced apart regions with a first control electrode over the space between said first and second region, and a second control electrode over the space between said second and third regions; and
   wherein each one of said sets of contacts includes a first contact for said first region, a second contact for said second region, and a third contact for said third region.

9. The cell as claimed in claim 8, wherein the center lines of the contacts of each set of contacts are equally spaced apart.

10. The cell as claimed in claim 8 further including a tunnel comprising a doped region disposed along said surface and extending along said plane of symmetry, said tunnel region having two access points, one access point being adjacent to said first contact, and the other access point being adjacent to said third contact.

11. The cell as claimed in claim 10 further including additional tunnels, one of said additional tunnels including a region of second conductivity type diffused in said substrate of first conductivity type and another one of said additional tunnels including a region of first conductivity type diffused in said well region of second conductivity type.

12. The cell as claimed in claim 10 wherein said tunnel region is a diffused region of second conductivity type formed in said substrate of first conductivity type.

13. The cell as claimed in claim 4 wherein said first and second power contacts are connected to the substrate region in which the transistors with which they are associated are formed.

* * * * *